US009793906B1

(12) United States Patent
Midha

(10) Patent No.: US 9,793,906 B1
(45) Date of Patent: Oct. 17, 2017

(54) RANGE AND PROCESS COMPENSATION FOR A DIGITAL PHASE LOCKED LOOP (PLL) OR FREQUENCY LOCKED LOOP (FLL) CIRCUIT

(71) Applicant: STMicroelectronics International N.V., Amsterdam (NL)

(72) Inventor: Gagan Midha, Panipat (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 15/251,570

(22) Filed: Aug. 30, 2016

(51) Int. Cl.
| H03L 7/06 | (2006.01) |
| H03L 7/10 | (2006.01) |
| H03L 7/183 | (2006.01) |
| H03L 7/083 | (2006.01) |
| H03L 7/091 | (2006.01) |
| H03L 7/099 | (2006.01) |

(52) U.S. Cl.
CPC ............. *H03L 7/10* (2013.01); *H03L 7/083* (2013.01); *H03L 7/091* (2013.01); *H03L 7/099* (2013.01); *H03L 7/183* (2013.01)

(58) Field of Classification Search
CPC ............................................... H03L 7/10
See application file for complete search history.

(56) References Cited

U.S. PATENT DOCUMENTS 5,424,688 A * 6/1995 Phillips .............. H03C 3/0925
331/16

OTHER PUBLICATIONS

Grollitsch, et al: "A 1.4psrms-period-jitter TDC-less Fractional-N Digital PLL With Digitally Controlled Ring Oscillator in 65nm CMOS," IEEE Int. Solid-State Circuits Conf. Dig. Tech. Papers, 2010, 3 pages.
Joshi, et al: "Bandwidth Compensation Technique for Digital PLL," IEEE Transactions on Circuits and Systems II, 2016, 5 pages.
Kratyuk, et al: "Frequency Detector for Fast Frequency Lock of Digital PLLs," Electronics Letters, 2007, 2 pages.
Weltin-Wu, et al: "A 3GHz Fractional-N All-Digital PLL With Precise Time-to-Digital Converter Calibration and Mismatch Correction," IEEE Int. Solid-State Circuits Conf. Dig. Tech. Papers, 2008, 3 pages.

* cited by examiner

*Primary Examiner* — Daniel Puentes
(74) *Attorney, Agent, or Firm* — Gardere Wynne Sewell LLP

(57) ABSTRACT

A locked loop circuit includes a controlled oscillator generate an output signal having a frequency set by an analog control signal. The analog control signal is generated by a first digital-to-analog converter (DAC) in response to a digital control signal and a bias compensation current signal. The bias compensation current signal is generated by a second DAC in response to a compensation control signal and a bias reference current. A compensation circuit adjusts the compensation control signal during compensation mode in response to a comparison of a frequency of the output signal to a frequency of a reference signal so as to drive the frequency of the output signal toward matching a desired frequency. The bias compensation current signal associated with the frequency match condition during compensation mode is then used during locked loop mode.

16 Claims, 4 Drawing Sheets

RANGE AND PROCESS COMPENSATION FOR A DIGITAL PHASE LOCKED LOOP (PLL) OR FREQUENCY LOCKED LOOP (FLL) CIRCUIT

TECHNICAL FIELD

The present invention relates to locked loop circuits such as, for example, a phase locked loop (PLL) or a frequency locked loop (FLL) circuit, and, in particular, to range and process compensation techniques for use in such locked loop circuits.

BACKGROUND

Digital phase locked loop (PLL) circuits are well known in the art. FIG. 1 shows a block diagram of such a circuit 10. The circuit 10 receives a reference frequency signal fref that is fed to a first input of a phase difference detector (PDD) 12. A second input of the phase difference detector 12 receives a feedback frequency signal ffb. As an example, the phase difference detector 12 may comprise a bang-bang phase detector (BBPD) or a time to digital converter (TDC) based phase detector. Such phase detector circuits are well known to those skilled in the art as described, for example, by Grollitsch, et al., "A 1.4psrms-period-jitter TDC-less fractional-N digital PLL with digitally controlled ring oscillator in 65 nm CMOS," IEEE Int. Solid-State Circuits Conf. Dig. Tech. Papers, 2010 and Weltin-Wu, et al., "A 3 GHz Fractional-N All-Digital PLL with Precise Time-to-Digital Converter Calibration and Mismatch Correction," IEEE Int. Solid-State Circuits Conf. Dig. Tech. Papers, 2008 (both documents incorporated by reference). The phase difference detector 12 determines a difference in phase between the reference frequency signal fref and the feedback frequency signal ffb and outputs a digital signal Ddif indicative of that measured difference. The digital output of the phase difference detector 12 is filtered by a digital low pass filter (LPF) circuit 14 which generates a digital control signal Dcont. A digital-to-analog converter (DAC) circuit 16 converts the digital control signal Dcont to an analog control signal Acont. A control input of an oscillator (OSC) circuit 18 (such as, for example, a current controlled oscillator (CCO) or a voltage controlled oscillator (VCO)) receives the analog control signal Acont and generates an output clock signal fout having a frequency Fco that is dependent on the magnitude of the analog control signal Acont. The oscillator circuit 18 may, for example, comprise a ring oscillator circuit biased by the analog control signal Acont. A divider circuit (/N) 20 divides the output clock signal fout by N to generate the feedback frequency signal ffb which is compared to the reference frequency to control loop operation. The loop circuit accordingly operates to cause the phase of the output clock signal to lock to the phase of the reference frequency signal fref, wherein a frequency of the output clock signal is an integer multiple (N) of the reference frequency signal fref.

The digital low pass filter circuit 14 may, for example, comprise a second order filter with a proportional gain β and an integral gain α. A bandwidth compensation (BC) circuit 22 updates the value for β and α in response to the digital signal Ddif to maintain constant bandwidth of the PLL. This compensation technique is taught by Joshi, et al., "Bandwidth Compensation Technique for Digital PLL," IEEE Transactions on Circuits and Systems II: Express Briefs, 2016 (incorporated by reference).

FIG. 2 shows a block diagram for a digital frequency locked loop (FLL) circuit 30. A count difference (CD) circuit 32 receives a reference count Cref at a first input and a feedback count Cfb at a second input. The count difference circuit 32 is a digital circuit that operates to determine a difference in the received count values and generate a digital signal Ddif indicative of that measured difference. The digital output of the count difference circuit 32 is then filtered by a digital low pass filter (LPF) 14 to generate a digital control signal Dcont. A digital-to-analog converter (DAC) circuit 16 converts the digital control signal to an analog control signal Acont. A control input of an oscillator (OSC) circuit 18 (such as, for example, a current controlled oscillator (CCO) or a voltage controlled oscillator (VCO)) receives the analog control signal Acont and generates an output clock signal fout having a frequency Fco that is dependent on the magnitude of the analog control signal Acont. A cycle counter circuit (CCC) 34 receives the output clock signal fout and a reference frequency signal fref. The cycle counter circuit 34 operates to count a number of cycles in the output clock signal fout which occur for each single cycle of the reference frequency signal fref. That count is the feedback count Cfb which is compared to the reference count to control loop operation. The loop circuit accordingly operates to cause a frequency of the output clock signal to lock to an integer multiple of a frequency of the reference frequency signal fref, wherein the integer multiple is designated by the value of the reference count Cref.

A band-gap reference (BGR) generator circuit 24 generates a reference current iref for the digital-to-analog converter circuit 16. The digital-to-analog converter circuit 16 may, for example, comprise a current steering digital-to-analog converter circuit that responds to the digital value of the digital control signal by actuating current sources (DAC elements) that are referenced (for example, mirrored with a defined mirroring ratio) to the reference current iref. The output currents from the actuated current sources are summed to produce an output current. That output current is the analog control signal Acont if the oscillator circuit 18 is a current controlled oscillator (CCO). Alternatively, the output current is converted to a voltage for the analog control signal Acont if the oscillator circuit 18 is a voltage controlled oscillator (VCO).

The digital-to-analog converter circuit 16 must have a high-resolution in order to minimize period jitter and instantaneous phase error in the PLL 10 of FIG. 1 or minimize period jitter in the FLL 30 of FIG. 2. The resolution is given by: Kdac/Fco, where Kdac is the gain per bit in Hertz of the digital-to-analog converter circuit 16 and Fco is the frequency in Hertz of the clock signal fout output from the oscillator circuit 18. For example, if a required resolution is 0.5% in frequency and the frequency Fco is 1 GHz, a Kdac of 5 MHz is required. This leads to a requirement for 200 DAC elements, which then means that the digital-to-analog converter circuit 16 must, at minimum, be an 8-bit DAC.

Any change in Kdac or Fco will change the percentage resolution and hence the bit requirement for the digital-to-analog converter circuit 16. Considering only one output frequency point, Kdac changes with a ratio of approximately 1:2 with process (dependent on technology). So, in order to account for process variation, it is necessary to design for twice the higher resolution. Designing for the best case scenario, Kdac will have to vary between 2.5 Mhz and 5 MHz leading to a requirement for 400 DAC elements and a corresponding 9-bit DAC. Similarly for a range in the frequency Fco of 1-3 GHz, this variation would necessitate designing for almost three-times the higher resolution. So, due to variation in process and range of output frequency, the number of elements in the DAC is given by Fco(max)/Kdac(min). In the example given above, this would be 3 GHz/2.5 MHz=1200 DAC elements thus requiring an 11-bit DAC. Unfortunately, the area of the digital-to-analog converter circuit 16 increases exponentially with increase in the required number of bits and this can introduce a huge area penalty on the circuit design.

There is accordingly a need for a technique for range and process compensation that does not require larger area-occupying circuitry.

SUMMARY

In an embodiment, a locked loop circuit comprises: an oscillator configured to generate an output signal having a frequency set by an analog control signal; a first digital-to-analog converter (DAC) configured to generate the analog control signal in response to a digital control signal, wherein the first DAC is biased by a compensation current signal; a second DAC configured to generate the compensation current signal in response to a compensation control signal, wherein the second DAC is biased by a reference current; and a compensation circuit configured to generate the compensation control signal in response to the output signal.

In an embodiment, the compensation circuit comprises: a successive approximation register storing a digital code and having an output configured to supply the digital code as said compensation control signal; and a count and compare circuit configured to count a first number of cycles of the output signal within a certain time period, compare the first number to a reference count and generate a logic signal for input to the successive approximation register in response to a result of the comparison.

In an embodiment, the compensation circuit comprises a feedback circuit configured to sense a frequency of the output signal and adjust the compensation control signal so as to drive the sensed frequency of the output signal toward matching a desired frequency during a calibration mode of operation.

In an embodiment, the compensation circuit comprises: a frequency comparison circuit configured to compare a frequency of the output signal to a frequency of a reference frequency signal; and a binary search circuit configured to adjust the compensation control signal in response to an output of the frequency comparison circuit so as to drive the frequency of the output signal toward matching a desired frequency during a calibration mode of operation.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
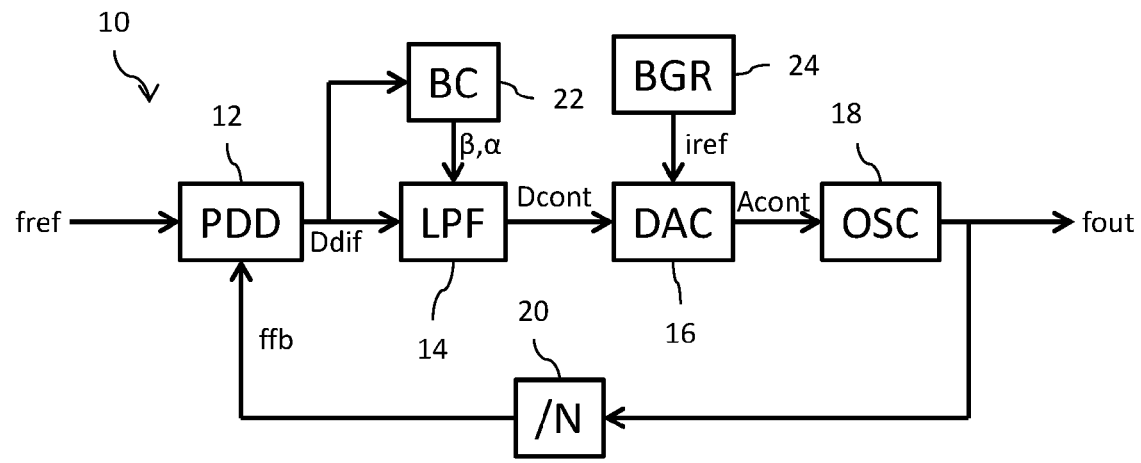
FIG. 1 shows a conventional configuration for a digital phase-lock-loop (PLL) circuit.
Figure 2:
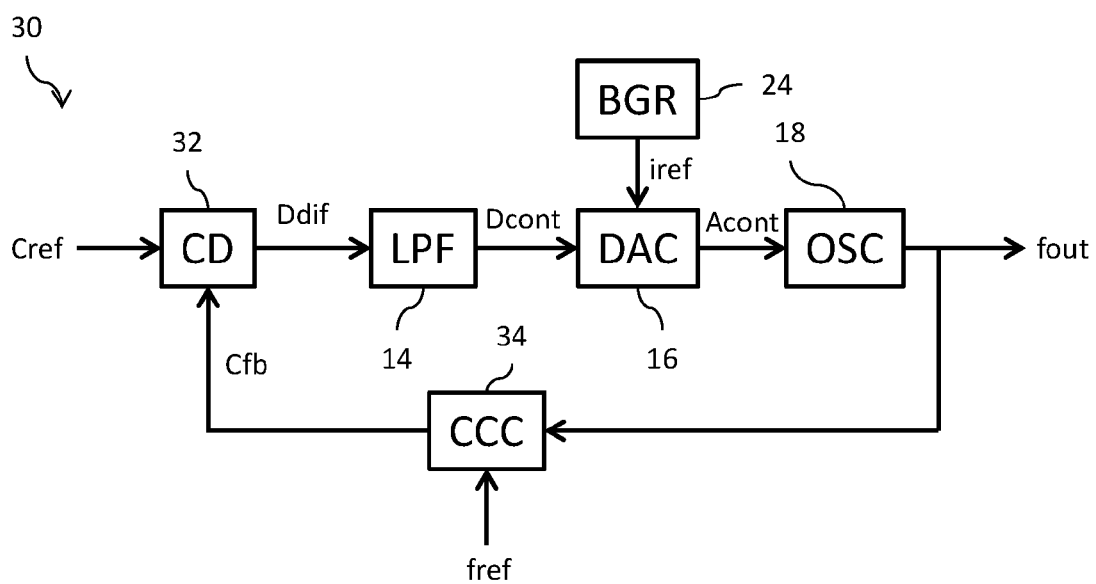
FIG. 2 shows a conventional configuration for a digital frequency-lock-loop (FLL) circuit.
Figure 3:
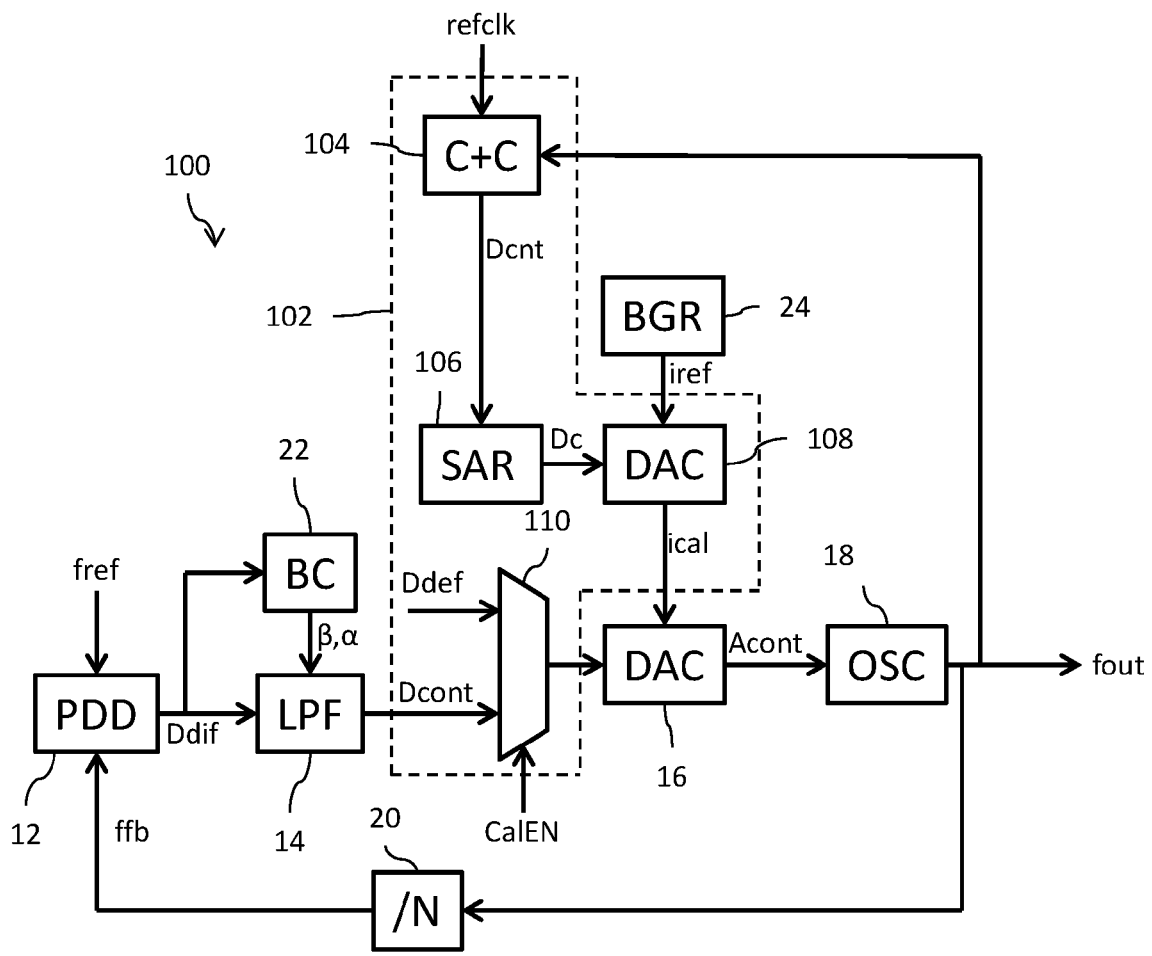
FIG. 3 shows a digital phase-lock-loop circuit with a range and process compensation.
Figure 4:
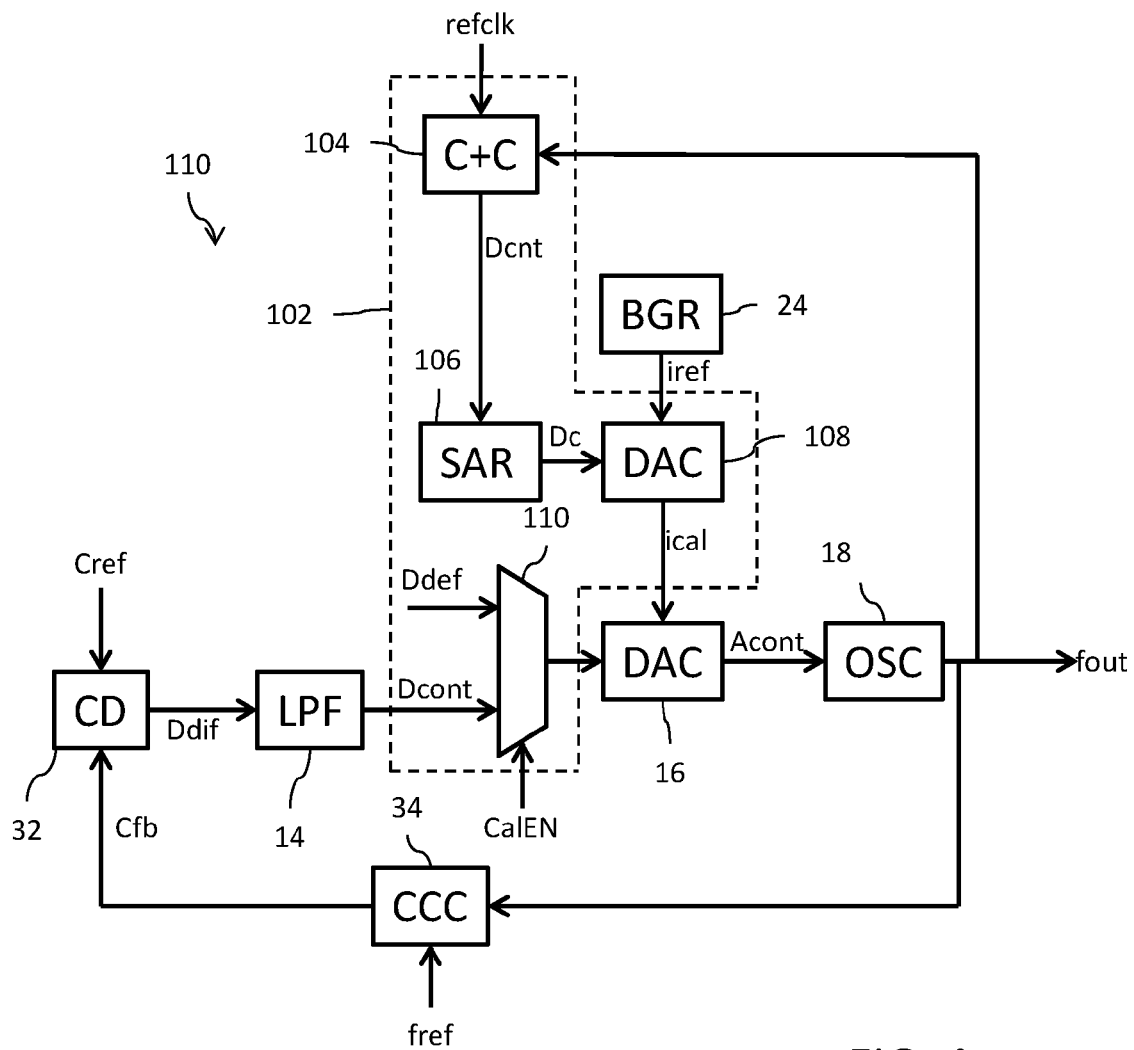
FIG. 4 shows a digital frequency-lock-loop circuit with a range and process compensation.

Reference is now made to FIGS. 3 and 4 showing block diagrams of a digital phase locked loop (PLL) circuit 100 and digital frequency-lock-loop (FLL) circuit 110, respectively, which include circuitry for range and process compensation. Like reference numbers refer to like or similar structures in FIG. 1, and no further discussion is made herein as to those components. Rather, the discussion herein will focus on differences. The circuit 100 of FIG. 3 differs from the circuit 10 of FIG. 1 in the inclusion of a range and process compensation circuit 102.

The compensation circuit 102 includes a count and compare (C+C) circuit 104 that receives the output clock signal fout and a reference clock signal refclk. The reference clock may, in an embodiment, correspond to the reference frequency signal fref. The C+C circuit 104 operates to count a number of cycles in the output clock signal fout which occur for a certain number of cycles of the reference clock signal refclk (i.e., count the cycles which occur during a certain time period). That count value is then compared to a reference count value to generate a logic signal Dcnt whose logic state indicates whether the count value is higher or lower than the reference count. The logic signal Dcnt is input to a search circuit, for example, a binary search circuit, and more particularly a circuit utilizing a successive approximation register (SAR) 106 and associated algorithm. The successive approximation register 106 is initialized with a digital code (Dc), and the value of that digital code (Dc) is updated by the algorithm bit-by-bit in response to the logic state of the logic signal Dcnt so as to perform a binary search process as known in the art. The digital code (Dc) is output from the successive approximation register 106 and converted by a digital-to-analog converter (DAC) circuit 108 to generate an analog calibration current (ical) signal.

A band-gap reference (BGR) generator circuit 24 generates a reference current iref for the digital-to-analog converter circuit 108. The digital-to-analog converter circuit 108 may, for example, comprise a current steering digital-to-analog converter circuit that responds to the digital value of the digital code (Dc) signal by actuating current sources (calibration DAC elements) that are referenced (for example, mirrored with a defined mirroring ratio) to the reference current iref. In an embodiment, the digital-to-analog converter circuit 108 comprises a 4-bit thermometric DAC including sixteen current sources, with each current source configured to generate a current that is $1/16$ of the reference current iref. The digital code (Dc) signal is a 4-bit signal that is decoded by the digital-to-analog converter circuit 108 to select which ones of the included current sources are actuated. The output currents from the actuated current sources are summed to produce the analog calibration current (ical) signal.

The analog calibration current signal provides the reference current for the digital-to-analog converter circuit 16. The digital-to-analog converter circuit 16 may, for example, comprise a current steering digital-to-analog converter circuit that responds to the digital value of the digital control signal by actuating current sources (DAC elements) that are referenced (for example, mirrored with a defined mirroring ratio) to the analog calibration current ical. The output currents from the actuated current sources are summed to produce an output current. That output current is the analog control signal Acont if the oscillator circuit 18 is a current controlled oscillator (CCO). Alternatively, the output current is converted to a voltage (by a current-to-voltage (I2V) circuit, not explicitly shown but well known in the art) for the analog control signal Acont if the oscillator circuit 18 is a voltage controlled oscillator (VCO). Relatively speaking, the digital-to-analog converter circuit 16 provides for a much higher resolution than the digital-to-analog converter circuit 108.

The compensation circuit 102 further includes a multiplexer circuit 110. The multiplexer circuit includes a first data input coupled to receive a default digital control signal Ddef. The multiplexer circuit further includes a second data input coupled to receive the digital control signal Dcont output from the digital low pass filter (LPF) circuit 14. A control input of the multiplexer circuit 102 receives a calibration enable (CalEN) selection signal. Responsive to a first logic state of the CalEN selection signal indicative of operation of the circuit 100 in a calibration mode, the multiplexer circuit 102 selects the default digital control signal Ddef at the first input for output to the digital-to-analog converter circuit 16. Conversely, in response to a second logic state of the CalEN selection signal indicative of operation of the circuit 100 in a (phase or frequency) locked loop mode, the multiplexer circuit 102 selects the digital control signal Dcont at the second input for output to the digital-to-analog converter circuit 16.

Operation of the circuit in the calibration mode is as follows. The CalEN selection signal is set in the first logic state and the successive approximation register 106 is initialized with an initial value of the digital code (Dc). This initial value is decoded by the digital-to-analog converter circuit 108 to actuate certain ones of the current sources (calibration DAC elements) that are referenced to the reference current iref to generate the analog calibration current ical. The default digital control signal Ddef is applied by the multiplexer to the digital-to-analog converter circuit 16 and decoded to actuate certain ones of the current sources (DAC elements) that are referenced to the analog calibration current ical. The digital-to-analog converter circuit 16 produces the analog control signal Acont and the oscillator circuit 18 responds thereto by generating the output clock signal fout. The C+C circuit 104 counts the number of cycles in the output clock signal fout which occur over a certain number of cycles of the reference clock signal refclk. That count is compared to the reference count to set the logic value of the count signal (Dcnt) in response to the comparison result, with that logic value applied to the input of the successive approximation register 106. In response thereto, the digital code (Dc) stored in the successive approximation register 106 is updated and in accordance with the search algorithm. The process then repeats. With each iteration of the process, the updating of the digital code (Dc) stored in the successive approximation register 106 drives the frequency of the output clock signal fout closer toward matching a desired frequency set as a function of the reference clock signal refclk and a fixed number of actuated current sources (DAC elements) in the digital-to-analog converter circuit 16 designated by the default digital control signal Ddef. When there are no more bits in the successive approximation register 106 to adjust, or when the frequency of the output clock signal fout is close enough to the desired frequency, the calibration mode terminates.

As a result of this calibration mode process, the analog calibration current ical is the current corresponding to the desired output frequency Fco and current process parameters. The final value of the analog calibration current ical now becomes the reference current for the digital-to-analog converter circuit 16 in locked loop mode. In this implementation, the DAC resolution is made constant (i.e., ical/M, wherein M represents the number of DAC elements). This effectively removes the process and range dependence.

With respect to the phase locked loop circuit 100 of FIG. 3, operation in the locked loop mode is as follows. The CalEN selection signal is set in the second logic state and the value of the digital code (Dc) stored in the successive approximation register 106 is fixed as a result of the previously completed calibration mode operation. The digital control signal Dcont is now applied by the multiplexer to the digital-to-analog converter circuit 16 and decoded to actuate certain ones of the current sources (DAC elements) that are referenced to the analog calibration current ical. The digital-to-analog converter circuit 16 produces the analog control signal Acont and the oscillator circuit 18 responds thereto by generating the output clock signal fout. The divider circuit (/N) 20 divides the output clock signal fout by N to generate the feedback frequency signal ffb. The phase difference detector 12 compares the phase of the reference frequency signal fref to the phase of the feedback frequency signal ffb. The phase difference detector 12 determines a difference in phase between the reference frequency signal fref and the feedback frequency signal ffb and outputs the digital signal Ddif indicative of that measured difference. The digital output of the phase difference detector 12 is filtered by the digital low pass filter (LPF) circuit 14 to generate the digital control signal Dcont. The loop circuit accordingly drives the phase of the output clock signal to lock to the phase of the reference frequency signal fref.

With respect to the frequency locked loop circuit 110 of FIG. 4, operation in the locked loop mode is as follows. The CalEN selection signal is set in the second logic state and the value of the digital code (Dc) stored in the successive approximation register 106 is fixed as a result of the previously completed calibration mode operation. The digital control signal Dcont is applied by the multiplexer to the digital-to-analog converter circuit 16 and decoded to actuate certain ones of the current sources (DAC elements) that are referenced to the analog calibration current ical. The digital-to-analog converter circuit 16 produces the analog control signal Acont and the oscillator circuit 18 responds thereto by generating the output clock signal fout. The cycle counter circuit (CCC) 34 counts a number of cycles in the output clock signal fout which occur for each single cycle of the reference frequency signal fref to generate the feedback count Cfb. The count difference (CD) circuit 32 determines a difference between the feedback count Cfb and the reference count Cref to generate the digital signal Ddif indicative of that measured difference. The digital output of the count difference circuit 32 is then filtered by a digital low pass filter (LPF) 14 to generate the digital control signal Dcont. The loop circuit accordingly drives the frequency of the output clock signal to lock to an integer multiple of a frequency of the reference frequency signal fref.

It will be understood that the use of an SAR-based algorithm is just one example of a suitable search algorithm. SAR is preferred in some embodiments because of its inherent minimum time of convergence. As alternatives, a first order settling or broken egg algorithm, as well known to those skilled in the art, could instead be used for the search technique and may be preferred in certain implementations.

Figure 5:
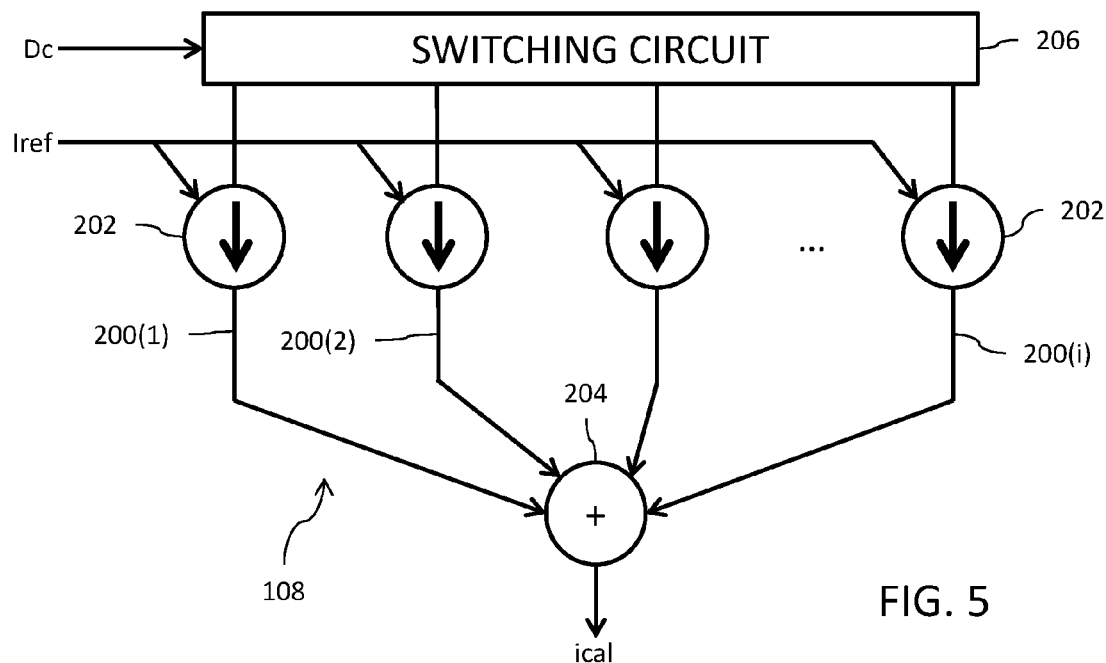
FIG. 5 is a block diagram of a calibration digital-to-analog converter.

FIG. 5 shows a block diagram of the digital-to-analog converter circuit 108. The circuit 108 includes a plurality of current branches 200(1)-200(i). Each branch includes a current source 202 biased by the reference current iref. A current summing circuit 204 sums the currents that are output from the current sources 202 to generate the calibration current ical. A switching circuit 206 controlled by the digital code (Dc) selectively actuates the current sources 202. The digital code (Dc) is decoded by the switching circuit 206 to control a actuation of a switch therein to enable a corresponding current source 202 to contribute current to the output calibration current ical.

Figure 6:
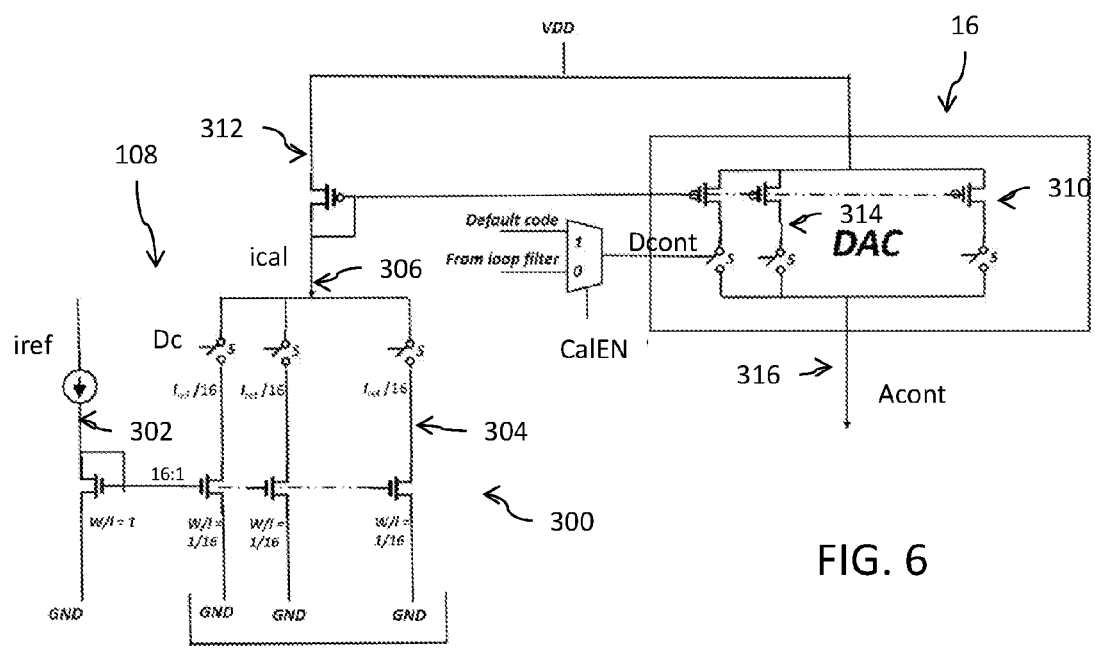
FIG. 6 is a circuit diagram for digital-to-analog converter circuits within the FIGS. 3 and 4.

FIG. 6 shows a circuit level implementation of the digital-to-analog converter circuit 108 and digital-to-analog converter circuit 16.

The digital-to-analog converter circuit 108 is preferably of a thermometric-type design and includes a first current mirroring circuit 300 formed by a plurality of n-channel MOS transistors. An input leg 302 of the first current mirroring circuit 300 is configured to receive the reference current iref output from the bandgap circuit 24. The input leg includes an input transistor. The first current mirroring circuit further includes a plurality of output legs 304 coupled to a current summing node 306. Each output leg 304 includes an output transistor. In an embodiment, i=16 and so the width/length ratio of the output transistors to the input transistor is 1:16. Thus, each output transistor can source a current that is equal to $\frac{1}{16}$(iref). Each output leg 304 further includes a switch that is actuated in response to the decoded value of the digital code (Dc). The output calibration current ical is generated at the current summing node 306. It will be understood that in an alternative implementation, the digital-to-analog converter circuit 108 may instead have a binary weighted or mixed (i.e., combined binary and thermometric) design. In any case, there is little area overhead associated with the provision of the digital-to-analog converter circuit 108 because it is a very coarse resolution DAC.

The digital-to-analog converter circuit 16, on the other hand, is a very fine resolution DAC that is preferably of a binary weighted or mixed design and includes a second current mirroring circuit 310 formed by a plurality of p-channel MOS transistors. An input leg 312 of the second current mirroring circuit 310 is configured to receive the calibration current ical output from digital-to-analog converter circuit 108. The input leg 312 includes an input transistor. The second current mirroring circuit 310 further includes a plurality of output legs 314 coupled to a current summing node 316. Each output leg 314 includes an output transistor. In an embodiment, the number of output legs/output transistors may, for example, be several hundred as discussed herein with respect to achieving a desired DAC resolution. A certain width/length ratio exists between the input transistor and each of the output transistors as defined by the binary or mixed design specification. Each output leg 314 further includes a switch that is actuated in response to the decoded value of the digital control signal Dcont. The oscillator control signal is generated at the current summing node.

The calibration process functions to set the output calibration current ical according to the frequency Fco and current process parameters. The number of output legs 304 that are actuated produces the output calibration current ical with a value that corresponds to a certain percentage of the dynamic range of the digital-to-analog converter circuit 16 when the CalEN selection signal is set to logic "1" and the multiplexer circuit 102 selects the default digital control signal Ddef for application to the input of the digital-to-analog converter circuit 16. This percentage is fixed according to two parameters. The first parameter is the change in ical due to temperature variation. The second parameter is the quantization error of the digital-to-analog converter circuit 108. In the example shown in FIGS. 4-5, the quantization error is +iref/32 to −iref/32. The digital-to-analog converter circuit 16 can be safely centered at 50-60% of the dynamic range. The quantization error of the digital-to-analog converter circuit 108 can be controlled by increasing or decreasing the number of bits, but the current variation due to temperature change is technology dependent and is normally around 20%. The centering of the digital-to-analog converter circuit 16 can be increased to maximize the advantage gained by using this technique.

As a result, the number of effective bits for the digital-to-analog converter circuit 16 can be reduced by a factor of 2-3 bits depending on the process and range variations. A 2-bit reduction corresponds to a 100-200% reduction in area. As known by those skilled in the art, the area occupied by the DAC is a large portion of the area occupied by the PLL/FLL circuit. Thus, the technique disclosed herein for range and process compensation can achieve significant area savings while maintaining a desired resolution percentage.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A locked loop circuit, comprising:
   an oscillator configured to generate an output signal having a frequency set by an analog control signal;
   a first digital-to-analog converter (DAC) configured to generate the analog control signal in response to a digital control signal, wherein the first DAC is biased by a compensation current;
   a second DAC configured to generate the compensation current in response to a compensation control signal, wherein the second DAC is biased by a reference current; and
   a compensation circuit configured to generate the compensation control signal in response to the output signal.

2. The circuit of claim 1, wherein the compensation circuit comprises:
   a successive approximation register storing a digital code and having an output configured to supply the digital code as said compensation control signal; and
   a count and compare circuit configured to count a first number of cycles of the output signal within a certain time period, compare the first number to a reference count and generate a logic signal for input to the successive approximation register in response to a result of the comparison;
   wherein the digital code is updated in response to said logic signal.

3. The circuit of claim 2, wherein the compensation circuit further comprises a multiplexing circuit configured to apply a default value for the digital control signal to the first DAC during a calibration mode of operation.

4. The circuit of claim 3, wherein the multiplexing circuit is configured to apply a loop value for the digital control signal to the first DAC during a locked loop mode of operation.

5. The circuit of claim 4, wherein the circuit is a phase locked loop (PLL), further comprising:
   a divider circuit configured to divide the output signal and generate a feedback signal; and a phase comparator circuit configured to compare a phase of the feedback signal to a phase of a reference frequency signal;

wherein the loop value for the digital control signal is derived from a result of the phase comparison.

6. The circuit of claim 4, wherein the circuit is a frequency locked loop (FLL), further comprising:

a cycle counter circuit configured to count a second number of cycles of the output signal relative to a cycle of a reference signal; and a count comparison circuit configured to compare the second number to a second reference count;

wherein the loop value for the digital control signal is derived from a result of the count comparison.

7. The circuit of claim 1, wherein the compensation circuit comprises a feedback circuit configured to sense a frequency of the output signal and adjust the compensation control signal so as to drive the sensed frequency of the output signal toward matching a desired frequency during a calibration mode of operation.

8. The circuit of claim 7, wherein the compensation circuit further comprises a multiplexing circuit configured to apply a default value for the digital control signal to the first DAC during said calibration mode of operation.

9. The circuit of claim 8, wherein the multiplexing circuit is configured to apply a loop value for the digital control signal to the first DAC during a locked loop mode of operation.

10. The circuit of claim 9, wherein the circuit is a phase locked loop (PLL), further comprising:

a divider circuit configured to divide the output signal and generate a feedback signal; and a phase comparator circuit configured to compare a phase of the feedback signal to a phase of a second reference frequency signal;

wherein the loop value for the digital control signal is derived from a result of the phase comparison.

11. The circuit of claim 9, wherein the circuit is a frequency locked loop (FLL), further comprising:

a cycle counter circuit configured to count a second number of cycles of the output signal relative to a cycle of a reference signal; and a count comparison circuit configured to compare the second number to a second reference count;

wherein the loop value for the digital control signal is derived from a result of the count comparison.

12. The circuit of claim 1, wherein the compensation circuit comprises:

a frequency comparison circuit configured to compare a frequency of the output signal to a frequency of a reference frequency signal; and a search circuit configured to adjust the compensation control signal in response to an output of the frequency comparison circuit so as to drive the frequency of the output signal toward matching a desired frequency during a calibration mode of operation.

13. The circuit of claim 12, wherein the compensation circuit further comprises a multiplexing circuit configured to apply a default value for the digital control signal to the first DAC during said calibration mode of operation.

14. The circuit of claim 13, wherein the multiplexing circuit is configured to apply a loop value for the digital control signal to the first DAC during a locked loop mode of operation.

15. The circuit of claim 14, wherein the circuit is a phase locked loop (PLL), further comprising:

a divider circuit configured to divide the output signal and generate a feedback signal; and a phase comparator circuit configured to compare a phase of the feedback signal to a phase of a second reference frequency signal;

wherein the loop value for the digital control signal is derived from a result of the phase comparison.

16. The circuit of claim 14, wherein the circuit is a frequency locked loop (FLL), further comprising:

a cycle counter circuit configured to count a second number of cycles of the output signal relative to a cycle of a reference signal; and a count comparison circuit configured to compare the second number to a second reference count;

wherein the loop value for the digital control signal is derived from a result of the count comparison.

* * * * *